United States Patent [19]

Lavene

[11] Patent Number: 4,614,995
[45] Date of Patent: Sep. 30, 1986

[54] HERMETICALLY SEALED CERAMIC CASED SURFACE MOUNT CAPACITOR

[75] Inventor: Bernard Lavene, Ocean, N.J.

[73] Assignee: Electronic Concepts, Inc., Eatontown, N.J.

[21] Appl. No.: 667,046

[22] Filed: Nov. 1, 1984

Related U.S. Application Data

[63] Continuation-in-part of Ser. No. 586,014, Mar. 15, 1984, Pat. No. 4,538,205.

[51] Int. Cl.⁴ ............................................. H01G 1/13
[52] U.S. Cl. .................................................. 361/308
[58] Field of Search .......... 361/321 C, 433 C, 433 W, 361/309, 310, 321, 402, 306, 308, 323

[56] References Cited

U.S. PATENT DOCUMENTS

| 1,721,152 | 7/1929 | Graham | 361/308 |
| 3,458,783 | 7/1969 | Rosenberg | 361/308 |
| 3,513,369 | 5/1970 | England et al. | 361/308 |
| 3,818,118 | 6/1974 | Bennett et al. | 361/308 X |
| 4,378,620 | 4/1983 | Lavene | 361/323 X |

FOREIGN PATENT DOCUMENTS

| 49423 | 9/1940 | Netherlands | 361/308 |
| 413746 | 7/1934 | United Kingdom | 361/306 |
| 2014792 | 8/1979 | United Kingdom | 361/308 |

Primary Examiner—Donald A. Griffin
Attorney, Agent, or Firm—Ratner & Prestia

[57] ABSTRACT

A planar terminated capacitor and a method for fabricating planar terminated capacitors is disclosed wherein a capacitor element is inserted in a nonconductive ceramic case. The case extends outwardly beyond the ends of the capacitor element forming cavities at each end of the case. Metal end caps are positioned at the ends of the case substantially enclosing the cavities. The end caps are electrically coupled to the ends of the capacitor element.

14 Claims, 6 Drawing Figures

HERMETICALLY SEALED CERAMIC CASED SURFACE MOUNT CAPACITOR

This is a Continuation-in-Part of Application Ser. No. 586,014 filed Mar. 5, 1984, now U.S. Pat. No. 4,538,205 issued 8/27/85.

BACKGROUND OF THE INVENTION

1. Field of the Invention

This invention relates to planar terminated surface mounted capacitors and more particularly to a capacitor which is hermetically sealed in a ceramic case.

2. Description of the Background Art

Direct mounting of electrical components, such as wound metallized polyester or metallized polycarbonate capacitors, is useful in thin and thick integrated hybrid circuitry. In previous attempts to accomplish this, unencapsulated capacitors were often used. Such capacitors required careful handling, and their protruding terminal leads were not strong. In fact, even after they were connected, they could not withstand most military environmental requirements.

Further, since many present day applications required components that could be planar mounted, encapsulated finished components having terminal leads could not be utilized.

Also, since such planar connections were usually accomplished by reflow soldering or similar means, it became apparent that what was needed was a component having the strength and versatility and heat resistance of an encapsulated element with the advantages of planar external terminal connections.

An ideal capacitor for this type of arrangement is a small chip capacitor of the type described in U.S. Pat. No. 4,378,620 which is incorporated herein by reference. This capacitor, however, was formed by bonding a lead to the electrodes in each edge thereby preventing planar mounting. Converting these finished electrical components to elements having planar terminations has been described in applicant's U.S. patent application Ser. No. 348,401, now U.S. Pat. No. 4,455,591 issued June 19, 1984. In this method, the leads were cut and end caps were placed over the ends of the component.

Applicant's U.S. patent application Ser. No. 586,014 teaches fabricating planar terminated capacitors which do not require cutting leads before placement of the end caps. However, these capacitors need an epoxy sleeve having low thermal resistance and were not hermetically sealed.

Furthermore, the difference in thermal coefficients between capacitor case (with higher heat resistance) and the capacitor element may be of large magnitude. This may result in loosening of the caps and lowered reliability especially in applications with wide temperature excursions.

It is, therefore, an object of the present invention to provide hermetically sealed planar terminated capacitors which may be fabricated directly from the capacitor elements having high thermal resistance.

It is a further object to provide a surface mounted capacitor which maintains reliability when there are large thermal excursions.

SUMMARY OF THE INVENTION

A planar terminated capacitor and method in which a capacitor element is inserted in a ceramic case which extends outwardly beyond the ends of the element. Metal end caps are hermetically sealed to the ends of the case. At least one of the metal end caps includes a spring to absorb the movement of the element caused by thermal expansion.

DETAILED DESCRIPTION OF THE INVENTION

Figures 1, 2A:
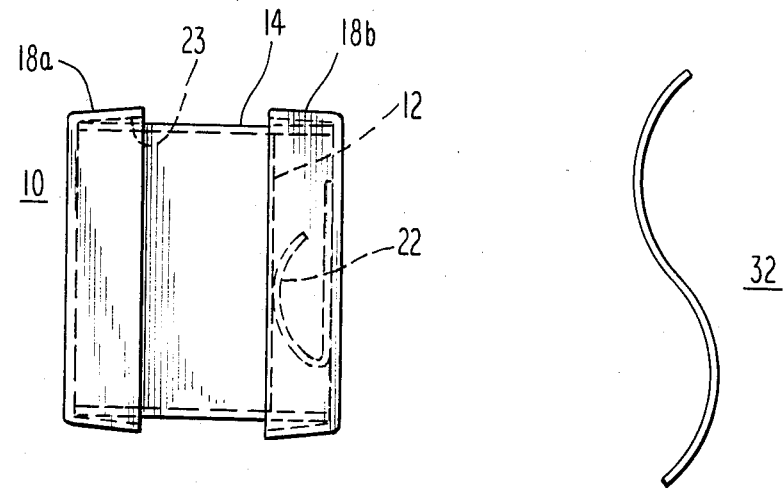
FIG. 1 is an illustration of the hermetically sealed ceramic cased surface mount capacitor of the present invention in its finished form.
FIG. 2A shows in cross section a wave spring used to electrically couple an end cap to a capacitor.
Figure 2:
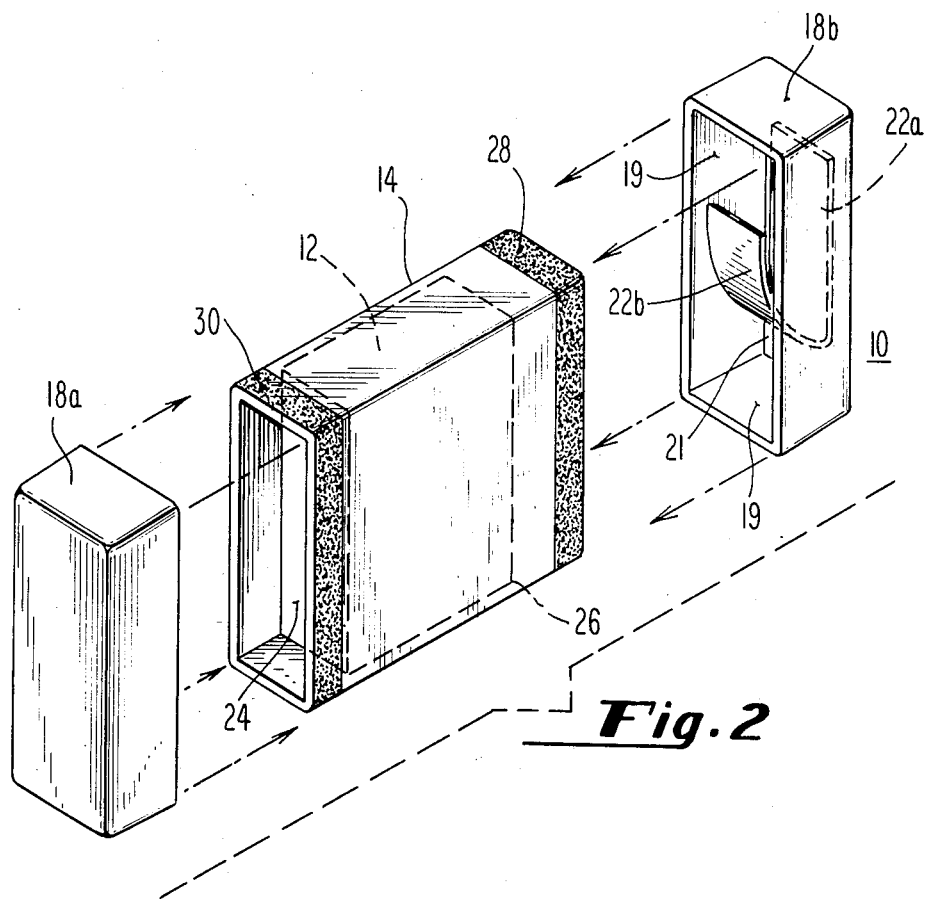
FIG. 2 is an exploded perspective view of the capacitor of FIG. 1.

Referring now to FIGS. 1 and 2 there is shown a representation of an hermetically sealed surface mount capacitor 10. As shown, capacitor 10 comprises a ceramic case 14 having box-shaped metal end caps 18a,b. Rectangular ceramic case 14 surrounds capacitor element 12. Capacitor element 12 is preferably a wound chip capacitor of the type described in U.S. Pat. No. 4,378,620. Preferably element 12 is square, but it may be elliptical.

End caps 18a,b serve as planar external terminal connections which may be soldered to a printed circuit board. Additionally, capacitor 10 includes C-spring 22 surrounded by end cap 18b, ceramic case 14 and capacitor element 12. C-spring 22 is welded to the rear inner wall 21 of end cap 18b prior to assembly of capacitor 10, and it electrically couples end cap 18b to element 12 while providing protection from movement of element 12 with respect to end caps 18a,b due to thermal expansion and shrinkage. C-spring 22 also applies force to element 12 causing element 12 to press against and be electrically coupled to end cap 18a.

C-spring 22 is formed of a berryllium copper alloy and has a thickness of approximately 0.003 inches. The rod portion 22a has a length of approximately 0.125 inches and the radius of the arcuate portion 22b is approximately 0.08 inches. The peak distance between portions 22a,b is approximately 0.04 inches.

Referring now to FIG. 2 there is shown an exploded view of capacitor 10. As shown, there is a chip capacitor element 12 within ceramic case 14. Nonconductive case 14 is preferably approximately 0.09 by 0.190 by 0.190 inches. The ends of capacitor element 12 are sprayed with a metal such as tin to form conductive terminals 24, 26 on the ends of element 12. This spraying is performed with a high velocity mixture of compressed air and molten fine particles of tin produced from an electric arc gun.

Ceramic case 14 also includes solder bands 28, 30. Solder bands 28, 30 are previously deposited on the surface of case 14 by firing a metal such as silver or gold onto the areas where solder is required such as the areas under bands 28, 30. This is followed by depositing hot tin onto the surface of the silver/gold case 14. The hot tin does not adhere to the portions of the surface of ceramic case 14 which have not been silver/gold fired but does adhere to the fired areas, for example, the areas beneath bands 28, 30. Solder bands 28, 30 encircle ceramic case 14 in the regions where end caps 18a,b will surround case 14 when case 14 is inserted into metal end caps 18a,b.

One end of ceramic case 14 is then inserted into end cap 18b which contains spring 22 welded to rear inner surface 21. This insertion causes solder band 28 to come in contact with all four inner side walls 19 of metal end cap 18b adjacent the edge of the cap. End cap 18b and ceramic case 14, including solder band 28 are heated sufficiently to allow acceptance of a high temperature molten solder which is fed between solder band 28 and end cap 18b. The high temperature solder which is fed in is selected to withstand the reflow process. This completely seals end cap 18b and case 14 around the entire circumference of case 14 where band 28 is deposited. End cap 18b is thus hermetically sealed.

After spraying and insertion of case 14 into cap 18b and hermetic sealing, terminal 26 of capacitor element 12 is inserted into case 14 until it abuts spring 22 of end cap 18b. This causes terminal 26 to be electrically coupled to spring 22 and thereby electrically coupled to end cap 18b.

Following insertion of capacitor element 12 into case 14, the remaining open end of case 14 is covered with end cap 18a. This causes the solder band 30 to come into contact with all four inner sides of inner surface 23 of end cap 18a adjacent the cap edge. When metal end cap 18a is pressed firmly over the end of case 14, terminal 24 of element 12 abuts metal end cap 18a and is pressed against the inner surface of metal cap 18a by the force exerted by spring 22.

End cap 18a and solder band 30 are then heated in the manner previously described for end cap 18b and solder band 28, thereby hermetically sealing metal end cap 18a to case 14.

Although the present invention as described includes a single spring 22 welded to rear inner surface 21, a second spring welded to the rear inner surface of end cap 18a may also be used. Furthermore, other types of springs may be used. Spring 22 as depicted in FIG. 1 is a C-spring. Alternately, a spring such as a conventional wave spring 32 shown in FIG. 2a may be used. When a wave spring 32 is used as part of hermetically sealed ceramic cased capacitor 10, it is not necessary to weld wave spring 32 to the inner surface of end cap 18b. As previously described for C-spring 22, a plurality of wave springs 32 may be inserted into capacitor 10, one within each of the end caps 18a.

It will be understood that this hermetically sealed ceramic capacitor is a planar component and possesses all of the advantages of planar elements. For example, orientation is simplified during manufacture. It is also understood that electric components, other than chip capacitors, may also be used. Such components may be elliptical or square capacitors which are fabricated discretely or chopped from rolls, or the like.

Figure 4:
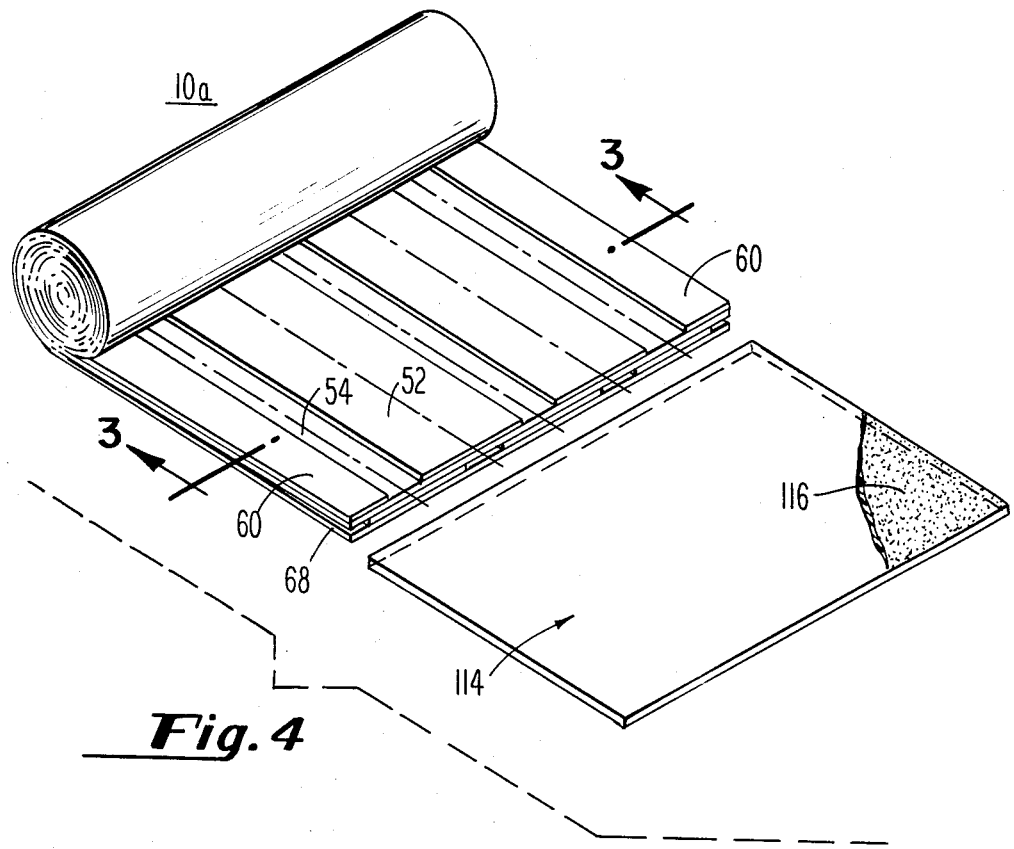
FIG. 4 is a diagramatic view illustrating the formation of the capacitors of the present invention.
Figure 3:
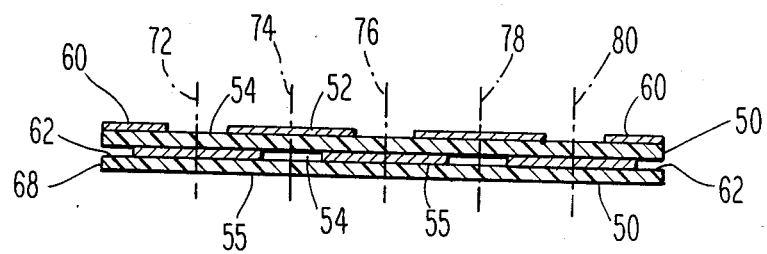
FIG. 3 is a cross section of webs used to form capacitors of the present invention.
Figure 5:
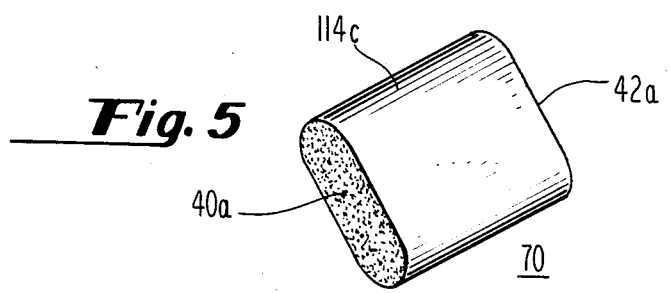
FIG. 5 is a perspective view of the chopped capacitor of the present invention.

Referring now to FIGS. 3-5, there is shown the preferred method in which capacitor element 12 is formed from chopped coil before insertion into ceramic case 14. In this method a wrap web 114 is provided for a capacitor coil 10a formed of a plurality of concentric longitudinally split electrodes disposed between dielectric webs in insulated and overlapping relation to one another. Individual small-sized chip capacitors 70, FIG. 5, are formed by chopping the coil as disclosed in applicant's U.S. Pat. No. 4,378,620, which is incorporated herein by reference.

Capacitor coil 10a comprises a mated pair of dielectric webs 50,68 with each web having a multiplicity of thin parallel metallic electrodes 52,55 respectively deposited on one side thereof and running along the length of the webs. The electrodes are separated by a set of parallel open spaces 54. The arrangement is such that outermost electrodes 60 lie along the edges of the first web 50 and on the second web 68 there are open unplated areas 62 along the corresponding edges. The electrodes are arranged across the width of the webs so that the eletrode space pattern on one is in a staggered and overlapping arrangement relative to that in the other so that substantially the central portion of a plated area on one of the webs is more or less over the center line of the open spaces directly above or below it.

As the winding of the coil is being completed, a short length of clear outer wrap web 114 is provided having the same width as webs 50,68. The longitudinal edges of web 114 are aligned with the corresponding longitudinal edges of webs 50,68. In conventional manner, the upper face of web 114 has an adhesive melt 116 formed thereon. Web 114 is of sufficient length so that after it is wound around capacitor 10a and the capacitor is tempered, it forms several plies.

In the winding operation, web 114 is required to be wound carefully. In this manner, as an integral part of the winding operation, web 114 is wound around the outer electrode layer of the capacitor coil.

On completion of the capacitor roll surrounded by web 114, the capacitor coil is flattened in conventional manner and then heated to temper dielectric webs 50,68 and to melt adhesive 116 thereby to form web 114 into a protective oval sleeve.

As described in U.S. Pat. No. 4,378,620, the staggered arrangement formed by capacitor coil 10a provides horizontal series of individual parallel plate capacitors 70 aligned next to each other along the coil and within the outer wrap 114. These capacitors are separated from each other by chopping the finished coil vertically along lines 72, 74, 76, 78, 80 to provide a clear cut through the web 114 and alternating open spaces and electrodes in webs 50,68. At the completion of the operation, there are formed a plurality of substantially small flattened rectangular shaped chip capacitors 70 shown in FIG. 5, each of which has an outer wrap protecting a series of concentric conductive elements with terminal bands formed adjacent both capacitor ends.

As shown in FIG. 5, chip capacitor 70 is protected by outerwrap section 114 and thereafter the ends of capacitor 70 may be sprayed with a high velocity mixture of compressed air and molten fine particles of metal. Specifically, as set forth in said patent, individual capacitors are lined up, in such a manner that the chopped ends form a composite assembly, and then sprayed. The spray forms terminal 40a in contact with an electrode within capacitor 70. Further, the spray forms terminal 42a which is in contact with another electrode within capacitor 70.

It is in this manner that a section of web 114 forms a protective outer wrap or sleeve which seals and closes chip capacitor 70. Chip capacitor 70 may be made of substantially the small size of ceramic capacitors such as 0.090×0.190×0.190 approximately and may be inserted into case 14 as previously described either in an elliptical form as shown or pressed into a rectangular form. Terminal 42a abuts and is electrically coupled to spring 22 after end cap 18b has been hermetically sealed to case 14. The remaining open end of case 14 may be covered with end cap 18a and hermetically sealed. Force applied to terminal 42a of capacitor 70 causes terminal 40a to press against end cap 18a thereby electrically coupling terminal 40a and end cap 18a. An additional C-spring 22 may be welded to the inner surface of metal end cap 18a before sealing and one or two wave springs 32 may replace C-springs 22.

Although the present invention has been described with respect to details of certain embodiments thereof, it is not intended that such details be limitations upon the scope of the invention.

For example, the present invention is not limited to smaller metallized film capacitors, but is also applicable to other components in general and their method of being formed into planar terminated components within hermetically sealed ceramic cases.

What is claimed is:

1. A planar hermetically sealed ceramic surface mount capacitor comprising:
   (a) a capacitor element having first and second terminals at opposite ends thereof;
   (b) a ceramic case for surrounding said capacitor element including first and second solder bands adhered to and completely encircling the outer surface of the case; and
   (c) first and second metal end caps each positioned at opposite ends of the solder band encircled case wherein the first end cap surrounds the first solder band and is electrically coupled to the first terminal and the second end cap surrounds the second solder band and is electrically coupled to the second terminal and both metal end caps are secured to the solder bands along the entire perimeter of the outer surface of the case thereby hermetically sealing the capacitor.

2. The capacitor of claim 1 in which there is further provided an electrically conductive spring adjacent to and electrically coupled to the second terminal.

3. The capacitor of claim 2 in which the spring comprises a C-spring.

4. The capacitor of claim 2 in which the spring comprises a wave spring.

5. The capacitor of claim 2 in which there is further provided an additional spring adjacent to and electrically coupled to the first terminal.

6. The capacitor of claim 1 in which the capacitor element comprises a wound chopped capacitor element.

7. The capacitor of claim 6 in which the wound chopped capacitor is wrapped in an outer web.

8. The capacitor of claim 1 in which the terminals comprise metal particles deposed by means of an electric arc gun.

9. The capacitor of claim 1 in which the bands are disposed substantially close to the ends of the ceramic case.

10. The capacitor of claim 1 in which the ends of the case extend substantially beyond the terminals.

11. A method of hermetically sealing a capacitor element having first and second terminals at opposite ends in a ceramic case to form a planar surface mount capacitor comprising the steps of:
    (a) adhering first and second solder bands to the outer surface of the ceramic case the solder bands completely encircling the outer surface of the case;
    (b) inserting the capacitor element into the solder band encircled case;
    (c) surrounding the first solder band by a first metal end cap and electrically connecting the first end cap to the first terminal and surrounding the second solder band by a second metal end cap and electrically connecting the second end cap to the second terminal; and
    (d) hermetically sealing the first and second end caps to the respective first and second solder bands along the entire perimeter of the outer surface of the case.

12. The method of claim 11 in which step (b) includes inverting a wound chopped capacitor element into the ceramic case.

13. The method of claim 11 in which step (a) includes the steps of firing a metal onto portions of the outer surface the ceramic case where the first and second solder bands are to be adhered and depositing tin on the fired portions.

14. The method of claim 11 in which step (c) includes positioning an electrically conductive spring between the second end cap and the second terminal for providing the electrical connection.

* * * * *